(12) United States Patent
Gaunekar et al.

(10) Patent No.: US 6,899,262 B2
(45) Date of Patent: May 31, 2005

(54) CLAMPING DEVICE

(75) Inventors: Ajit S. Gaunekar, Singapore (SG); Gary Peter Widdowson, Hong Kong (CN)

(73) Assignee: ASM Technology Singapore PTE LTD, Singapore (SG)

( * ) Notice: Subject to any disclaimer, the term of this patent is extended or adjusted under 35 U.S.C. 154(b) by 56 days.

(21) Appl. No.: 10/441,859

(22) Filed: May 19, 2003

(65) Prior Publication Data

US 2004/0232203 A1 Nov. 25, 2004

(51) Int. Cl.[7] .............................. B23K 37/00; B23K 1/06
(52) U.S. Cl. ..................... 228/44.3; 228/44.7; 228/1.1; 228/4.5
(58) Field of Search .......................... 228/1.1, 4.5, 44.3, 228/44.7, 180.5

(56) References Cited

U.S. PATENT DOCUMENTS

| | | | | |
|---|---|---|---|---|
| 3,430,834 A | * | 3/1969 | Mansour et al. ............. 228/1.1 |
| 6,439,448 B1 | * | 8/2002 | Ringler ..................... 228/110.1 |
| 6,513,696 B1 | * | 2/2003 | Ho et al. ..................... 228/4.5 |
| 6,783,052 B2 | * | 8/2004 | Liao et al. ................... 228/4.5 |

* cited by examiner

Primary Examiner—Lynne R. Edmondson
(74) Attorney, Agent, or Firm—Ostrolenk, Faber, Gerb & Soffen, LLP (57) ABSTRACT

A clamping device is provided for clamping an object, such as bonding wire for a wire bonding machine. The device comprises a pair of clamping arms arranged in pivotal relationship with each other about a pivot point, the clamping arms having clamping ends movable between an open position and a closed position. An attraction device is operative to provide an attraction force between the clamping arms about the pivot point. The device includes biasing means that is operative to provide a biasing force in opposition to the attraction force about the pivot point, such that the biasing force is operative to bias the clamping ends towards the closed position. In a preferred embodiment, the biasing means comprises a flexure bearing.

19 Claims, 5 Drawing Sheets

Fig. 1

(Prior Art)

CLAMPING DEVICE

FIELD OF THE INVENTION

The present invention relates to a clamping device, especially but not limited to a clamping device in the form of a wire clamp used generally in wire bonding machines or wire bonders in the semiconductor assembly industry.

BACKGROUND AND PRIOR ART

In a wire bonding process, electrically conductive wires are bonded between electrical contact pads found on a semiconductor die and leads on a substrate onto which the die is attached, usually a semiconductor leadframe. The wire needs to be held firmly, fed to the bonding site and stripped off at appropriate junctures in the process. This is usually achieved using a wire clamp. Over the years, the operational speed of wire bonding machines has increased considerably, with the result that the wire clamp needs to be actuated at high speed while exerting controlled force on the wire being clamped, without damaging the wire.

Modern day wire bonders for making so-called "ball-bonds" are designed to execute a rocking motion of a bond-body which carries a bonding tool, about a suitably located pivot. Since the wire clamp is generally carried on the rocking bond-body, it needs to be made as light as possible. Its inertia about the bond-body pivot axis needs to be as small as possible in order to enable high speed bonding operation without need for an unduly large actuator or motor for actuating movement of the bond-body. Even so, the wire clamp needs to have high static and dynamic stiffness thus giving rise to high resonant frequencies of vibration. This ensures that any residual vibration of the wire clamp at the end of the bond-body stroke is of low amplitude and high frequency, and that it settles fast enough, to enable high speed bonding without adversely affecting the bond quality.

In the past, a variety of actuation methods such as voice coil motors, solenoids, piezo-electric actuators, magneto-strictive actuators and others, have been used to actuate wire clamps in wire bonders.

U.S. Pat. Nos. 3,672,556 and 4,142,714 disclose similar variations of a solenoid actuated wire clamp. These designs are of a "normally open" type meaning that if the power to the solenoid is cut off, the clamp remains in the open position, thereby unclamping the wire. Present-day wire bonders demand a "normally closed" type wire clamp. Also, the designs in the aforesaid patents require numerous parts to transmit the actuation force from the solenoid to the clamping location. This makes it cumbersome for present-day high speed wire clamping wherein the clamp may need to operate at a rate of about 20 times per second or even more. At this speed of operation, the long term reliability of the clamp is also questionable, since it contains several parts which slide against each other, thus leading to friction and wear.

Several designs of piezo-electric wire clamps have also been patented, such as, for example, in U.S. Pat. Nos. 5,901,896, 5,388,751 and 5,314,175. These involve expensive piezo-electric actuator elements and compliant structures made using expensive wire EDM (Electro Discharge Machining). The operating voltages for piezo-electric actuators, in the range of 100–200 volts, are much higher than those for electromagnetic actuators (eg. solenoids and voice coil motors).

Figure 1:
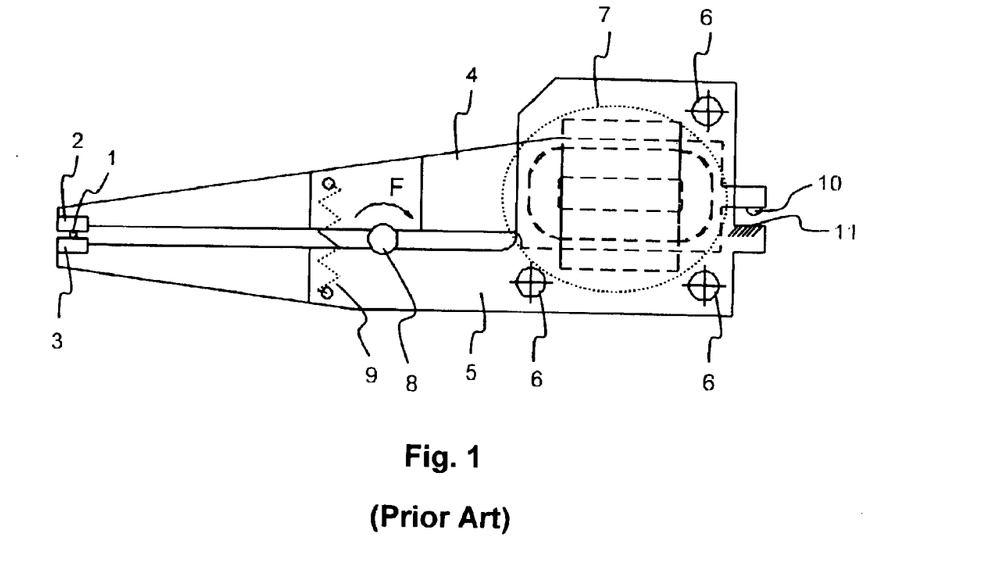
FIG. 1 shows a prior art wire clamp using a voice coil motor.

FIG. 1 shows a commonly used voice coil motor actuated wire clamp. Wire 1 is clamped between damper plates 2 and 3 affixed to the ends of a movable arm 4 and fixed arm 5 respectively. The wire clamp is mounted on a bond-body through mount holes 6 on the fixed arm 5. A voice coil motor 7 is used to actuate the movable arm 4 with respect to the fixed arm 5. The movable arm 4 is pivotally mounted on the fixed arm 5 using smooth and hard pivot ball bearings 8 made of wear-free material, eg. ruby. Extension spring 9 provides a small initial bias force (also called "preload force") between the movable and fixed arms 4, 5. The extension spring 9 is located on the same side of the pivot balls 8, as the damper plates 1, 2, thus ensuring that the clamp is normally closed. When the coil of the voice coil motor 7 is energized by an electric current in one direction, a force is exerted on the movable arm 4 such that the movable arm 4 rotates about pivot balls 8 in the direction indicated by arrow F, thus opening the wire clamp. On de-energizing the coil, the spring force of spring 9, rotates the movable arm 4 about the pivot balls 8 in the direction opposite to arrow F, thus closing the wire clamp. When the coil is energized by an electric current in the opposite direction, the motor force tends to increase the clamping force on the wire 1 between damper plates 2 and 3. The clamp opening stroke of the movable arm 4, is limited by including a hard stopper ball 10 to come into contact with a hardened surface 11 of the fixed arm 5 at a fully-opened position.

As seen in the above description, such a wire clamp has numerous components and uses a spring loaded pivot ball bearing 8. The ball bearing 8 on its own does not contribute to a force to close the wire clamp, thus requiring a spring 9 in addition to the force generated by the voice coil motor 7 to contribute to clamping force. The use of a voice coil motor 7 involves a bulkier device and makes operation of the wire clamp relatively more complex.

SUMMARY OF THE INVENTION

The present invention seeks to provide a design of a clamping device that serves to reduce the number of components, and simplify the assembly of the clamping device.

Accordingly, the invention provides a clamping device for clamping an object comprising a pair of clamping arms arranged in pivotal relationship with each other about a pivot point, the clamping arms having clamping ends movable between an open position and a closed position; an attraction device operative to provide an attraction force between the clamping arms about the pivot point; and biasing means operative to provide a biasing force in opposition to the attraction force about the pivot point; wherein the biasing force is operative to bias the clamping ends towards the closed position.

It will be convenient to hereinafter describe the invention in greater detail by reference to the accompanying drawings which illustrate one embodiment of the invention. The particularity of the drawings and the related description is not to be understood as superseding the generality of the broad identification of the invention as defined by the claims.

BRIEF DESCRIPTION OF DRAWINGS

Examples of preferred embodiments of a clamping device in accordance with the invention will now be described with reference to the accompanying drawings, in which.

DETAILED DESCRIPTION OF THE PREFERRED EMBODIMENT

Figure 2:
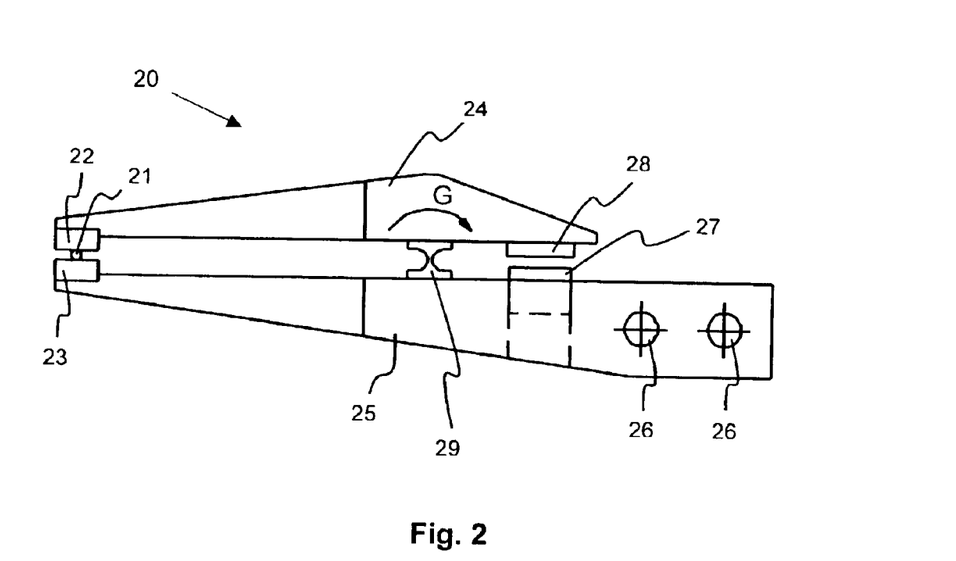
FIG. 2 shows a wire clamp according to a first preferred embodiment of the present invention.

The structure and function of a clamping device according to the preferred embodiments of the present invention are now described. FIG. 2 shows a clamping device for clamping an object, in the form of a wire clamp 20 for clamping a bonding wire 21 according to a first preferred embodiment of the present invention. The wire clamp 20 includes a pair of clamping arms, one of which may be a fixed arm 25 mounted on a bonder body (not shown) using mounting holes 26. The other clamping arm may be a movable arm 24 that is arranged in a pivotal relationship with the fixed arm 25 about a pivot point. The movable arm 24 is mounted on the fixed arm 25 using a flexure bearing 29, which is designed to restrict all degrees of freedom of the movable arm 24 but one, with respect to the fixed arm 25. All three translational degrees of freedom and the two rotational degrees of freedom apart from that indicated by arrow G, of the movable arm 24, are substantially restricted. In other words, the flexure bearing 29 allows the movable arm 24, only to rotate in the direction indicated by arrow G and opposite to arrow G about a pivot point that is located in the flexure bearing 29 towards open and closed positions of clamping ends of the clamping arms 24, 25.

The flexure bearing 29 is adapted to flex about the pivot point and is capable of providing a preload force to the clamping device 20. The shape of the flexure bearing 29 as depicted in the FIG. 2 is only symbolic and those skilled in the art can conceive of several possible designs of the same. The material from which the flexure bearing 29 is made is preferably a metal with high specific strength, i.e. a high ratio of strength to density, such as for example, a Titanium alloy.

An attraction device, such as a solenoid 27 coupled to the fixed arm 25, is positioned in such a way so as to be in apposition with a solenoid plate 28 made of soft iron that is affixed to the movable arm 24. The solenoid is operative to provide an attraction force between the clamping arms 24, 25 about the pivot point in the flexure bearing 29. It is possible to precisely adjust a gap between the solenoid plate 28 and the solenoid 27, by moving the solenoid 27 towards or away from the soft iron plate 28 before locking or gluing the solenoid 27 in place.

Figure 3:
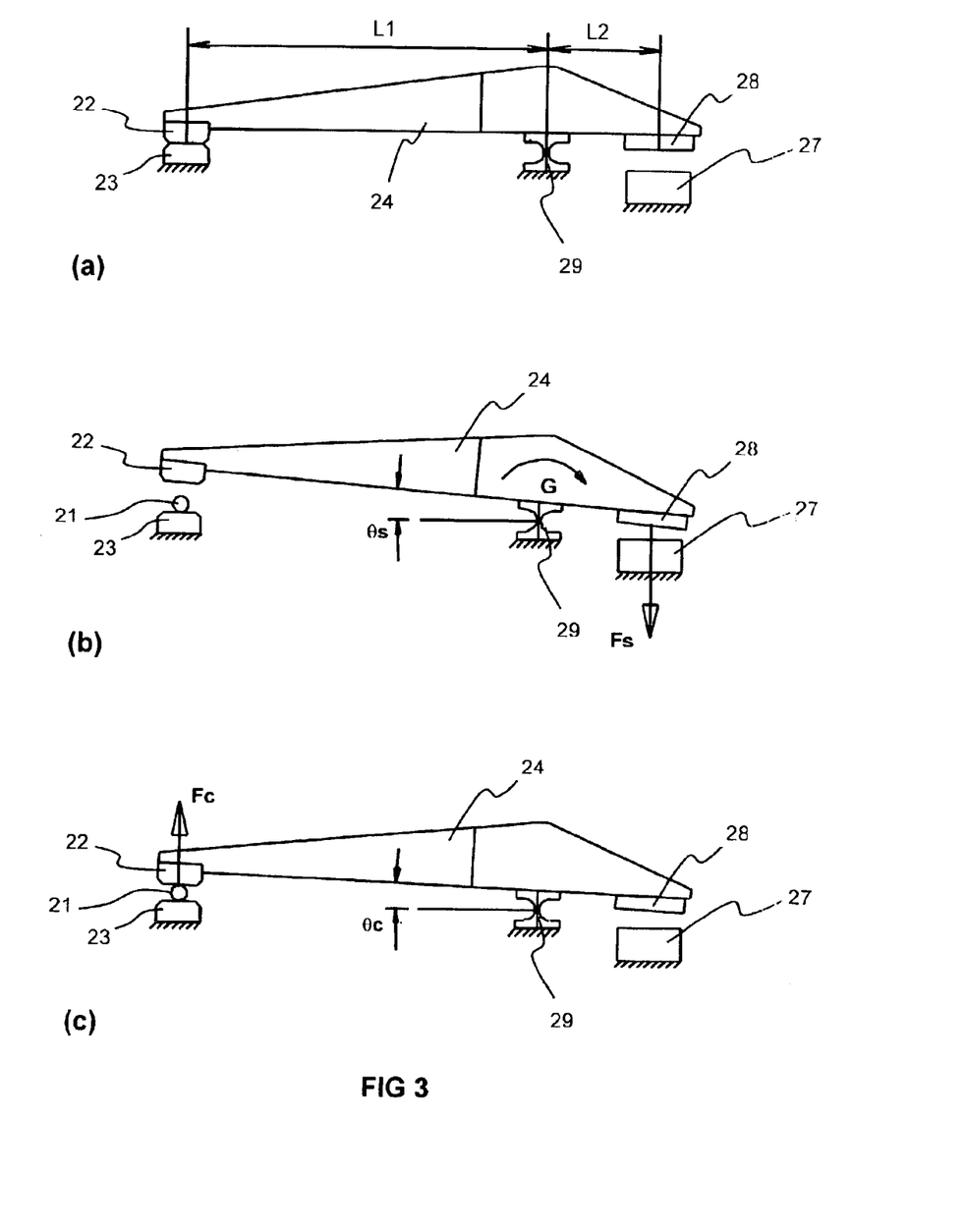
FIG. 3(a) depicts the condition when the solenoid is not energized.
FIG. 3(b) depicts the declamping action.
FIG. 3(c) depicts the deenergizing of the solenoid.

FIG. 3 illustrates the operation of the clamp of FIG. 2. Biasing means, such as the flexure bearing 29 that is designed to provide a preload or biasing force, is operative to bias the clamping ends of the clamping arms towards a closed position, thus ensuring a "normally closed" design. When the solenoid 27 is not energized, as shown in FIG. 3a, the clamping ends that include clamper plates 22, 23 are in light contact with each other due to the aforesaid arrangement of the flexure bearing 29. It can be assumed that the initial preload force between the damper plates 22, 23 is negligibly small. In this case, there exists no substantial deformation and strain in the flexure bearing 29.

De-Clamping Action

Upon electrically energizing the solenoid 27, a force is exerted on the solenoid plate 28 affixed on the movable arm 24. The resulting actuating moment, Ms about the flexure 29 (in the direction of arrow G), rotates the movable arm 24 in the direction indicated by arrow G through a small angle, resulting in the movable damper plate 22 moving away from the fixed damper plate 23 thus opening the clamp as shown in FIG. 3b. At the same time, rotation of the movable arm 24 reduces the gap between the solenoid 27 and the solenoid plate 28. The reduction in the gap increases the solenoid force on the movable arm 24. The rotation of the movable arm 24 is resisted by the flexure bearing 29 with a restoring moment Mfo, (opposite to arrow G) which is the product of the rotational stiffness Kt of the flexure bearing 29 and the angle of rotation θs of the movable arm 24.

$$Mfo = Kt \times \theta s \tag{1}$$

Thus as the angle of rotation increases, both the actuating moment Ms (in the direction of arrow G) and the restoring moment Mfo (opposite to arrow G) on the movable arm increase in magnitude. The flexure bearing 29 is preferably designed such that, for an incremental increase in the angle of rotation of the movable arm 24, the rotational stiffness of the flexure bearing 29 is high enough to enable the restoring moment Mfo to increase faster than the actuating moment Ms due to the solenoid. This is to achieve a condition of stable equilibrium whereby both the moments exactly balance each other at a given angular position of the movable arm 24 and furthermore maintain the equilibrium position even under small disturbances.

Thus in the stable equilibrium position,

Ms = Mfo $$Fs \times L2 = Kt \times \theta s \tag{2}$$

where L2 is the distance of the effective line of action of the solenoid force from the effective pivot of rotation, as provided by the flexure bearing 29.

The above equation (2) shows that the angle of rotation of the movable arm 24 and in turn, the clamp opening gap between the damper plates 22 and 23 is proportional to the force of the solenoid which can be controlled by the amount of electric current fed into the solenoid 27.

During de-clamping action, as depicted in FIG. 3b, the current in the solenoid is kept high enough so that the clamp opening gap between the damper plates 22, 23 is large enough for a bonding wire 21 introduced into the gap, to be free of any clamping force.

Clamping Action

On complete de-energizing of the solenoid 27, as shown in FIG. 3c, the force over the solenoid plate 28 is reduced to zero. Thus the unbalanced restoring moment Mfo resulting from the elastic strain of the deformed flexure bearing 29 rotates the movable arm 24 in the direction opposite to arrow G. In the absence of bonding wire 21 between the damper plates 22, 23, the movable arm 24 would have rotated back completely until movable damper plate 22 comes into contact with the fixed damper plate 23, thus closing the-clamp as shown in FIG. 3a leading to a complete release of elastic strain and almost no residual deformation in the flexure bearing 29. However, the presence of the bonding wire 21 between the damper plates 22, 23 leads to stoppage of the movable arm 24 before all the elastic strain in the flexure bearing 29 can be released. This strain manifests as a clamping moment Mc which is balanced by a reaction moment Mr resulting from a normal reaction force Fc at the damper plates 22, 23, at a nominal distance L1 from the effective pivot point in the flexure bearing. According to Newton's third law of motion, the reaction force Fc is the same as the clamping force.

In this case, the equation representing the moments at this position can be written as:

$$Mc=Mfc$$

$$Fc \times L1 = Kt \times \theta c \qquad (3)$$

Where $\theta c$ is the angle between the orientation of the movable arm 24 in the presence of the wire clamped between dampers 22, 23 (as shown in FIG. 3a) and its orientation without the wire between the dampers (as shown in FIG. 3c).

Now, the angle $\theta c$ is proportional to the diameter of the wire dw.

$$\theta c = dw/L1 \qquad (4)$$

It can be deduced from equations (3) and (4) that the clamping force Fc is proportional to the diameter dw of the wire 21 being clamped. It is consistent for the clamping force to increase with increasing wire diameter, dw.

Control of Clamping Force

As seen from the above description, the clamping action in the present invention is provided passively which means that there is no active actuator providing the clamping force. Clamping is effected by the elastic strain of the deformed flexure bearing 29. However, de-clamping is achieved by positive actuation by the solenoid 27.

For high quality bonding processes, there is a narrow tolerance band defining allowable deviation above and below the appropriate clamping force required for each wire diameter. If the clamping force is too high, it might lead to undesirable flattening of the wire due to plastic deformation. Too low a clamping force is also unacceptable since the wire will slip when it needs to be clamped firmly and pulled to be stripped off at the right time in the bonding process.

It is difficult to design and fabricate a flexure bearing 29 to give exactly the right amount of clamping force falling within the narrowly specified force tolerance band for each wire. In order to overcome this problem, the following strategy is adopted. As seen in equation (3), the clamping force for a given wire diameter (dw) is proportional to the rotational stiffness Kt of the flexure bearing 29. Keeping this in mind, the flexure bearing 29 is specifically designed to have higher stiffness than is needed for the right amount of clamping force. The extra clamping force is then countered using the solenoid 27. So in this method, de-clamping is effected in the same manner as described before (FIG. 3b) whereby the solenoid 27 is energized by an electric current high enough to overcome the flexure bearing 29, thus creating a gap between the damper plates, which is larger than the wire diameter dw. However, when the wire is required to be clamped, the current in the solenoid 27 is not shut off completely but is reduced to a value that is low enough so that the actuating moment (Ms=Fs×L2) due to the solenoid force partially cancels the flexure moment (Kt×$\theta$c) to give the clamping moment (Fc×L1).

$$Fc \times L1 = (Kt \times \theta c) - (Fs \times L2) \qquad (5)$$

This equation reduces to equation (3), if the solenoid 27 is de-energized completely (Fs=0).

Thus we see that the clamping force is adjustable by changing the attraction or solenoid force Fs relative to the biasing force from elastic strain of the flexure bearing 29. For a given flexure bearing 29, and clamp dimensions (L1, L2), the clamping force Fc for each wire diameter can be controlled by adjusting the solenoid force Fs to an appropriate value, by adjusting the requisite amount of current in the solenoid 27.

Figure 4:
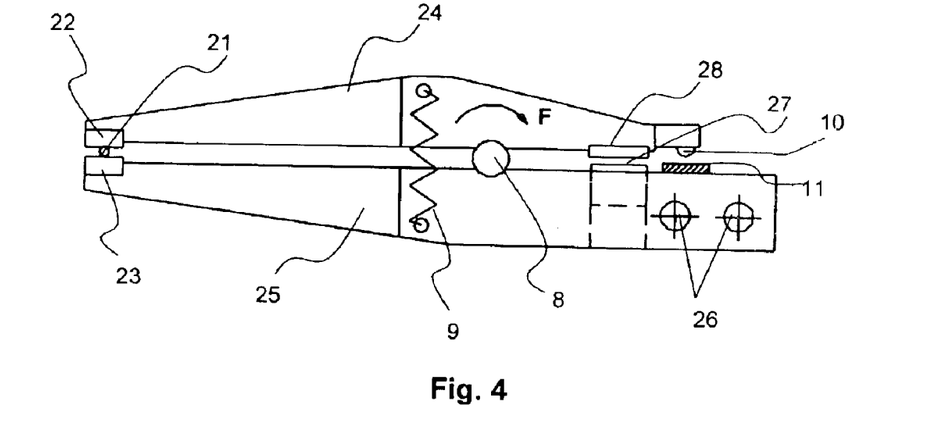
FIG. 4 shows a wire clamp according to a second preferred embodiment of the invention.

FIG. 4 shows a wire clamp according to a second preferred embodiment of the invention. Instead of a flexure bearing 29, this embodiment uses a conventional ball bearing 8 and extension spring 9 to provide a clamping force when the solenoid 27 is de-energized. The biasing means may therefore be a spring 9 instead of a flexure bearing 29. Otherwise, this wire clamp functions in a similar way to the first embodiment, i.e. it has a "normally closed" design. Here, the clamping opening stroke of the movable arm 24 may be limited by including a hard stopper ball 10 to come into contact with a hardened surface 11 of the fixed arm 25 when the solenoid 27 is energized and the wire clamp is in a fully-open position.

Figure 5:
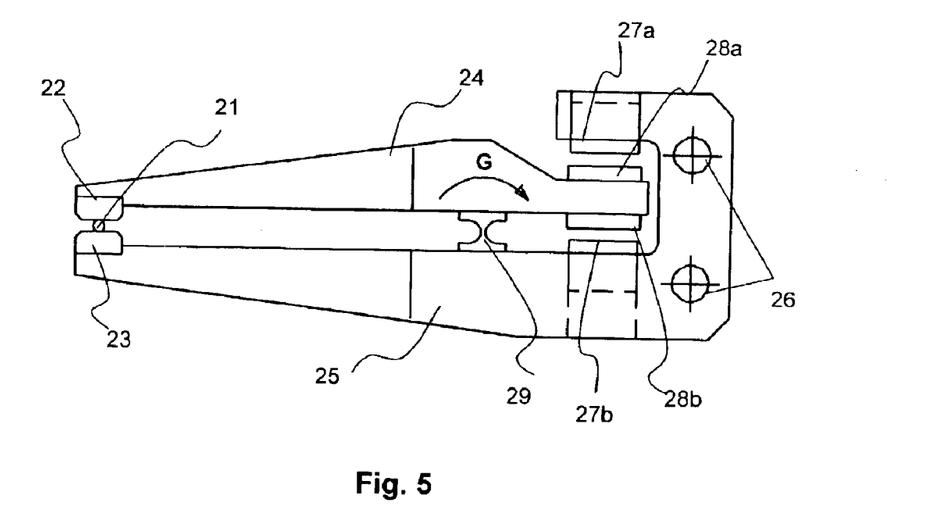
FIG. 5 shows a wire clamp according to a third preferred embodiment of the invention.

FIG. 5 shows a wire clamp according to a third preferred embodiment of the invention. The variation in this embodiment as compared to the first embodiment is that the biasing means comprises a second attraction device such as a solenoid 27b, and the movable arm 24 is movable between a first solenoid 27b and the second solenoid 27a. There are thus two solenoid devices 27a, 27b to actuate the movable arm 24. There are solenoid plates 28a, 28b affixed to each side of the movable arm 24 adjacent to each solenoid 27a, 27b respectively.

In this embodiment, a clamping force may be primarily provided by the additional solenoid 27a instead of just from the flexure bearing 29. Therefore, the two solenoids 27a, 27b are adapted to cooperate to reciprocate the movable arm so as to actuate opening and closing of the wire clamp. In this design, the primary function of the flexure bearing 29 is to provide a pivot point, as well as some biasing force in a direction opposite to direction G to keep the wire clamp in a "normally closed" position even when both solenoids 27a, 27b are de-energized. Alternatively, a closing force may be provided solely by the additional solenoid 27a. It should be appreciated that a ball bearing may also be used instead of the flexure bearing 29 to provide the pivot point.

Damping

It is an inherent difficulty when using flexure bearings 29 that the amount of damping in flexures is very low, with the result that flexure based motion devices keep vibrating for an undesirably long period of time before their attenuation reaches a level acceptable to the specified objective at hand. This not only slows down the entire process considerably but may also adversely affect other sub-systems in the vicinity, whose operations are sensitive to vibrations transmitted from the device in question. In order to substantially speed up the attenuation of undesirable vibrations, it is preferable that some kind of damping be introduced into the system.

Figure 6:
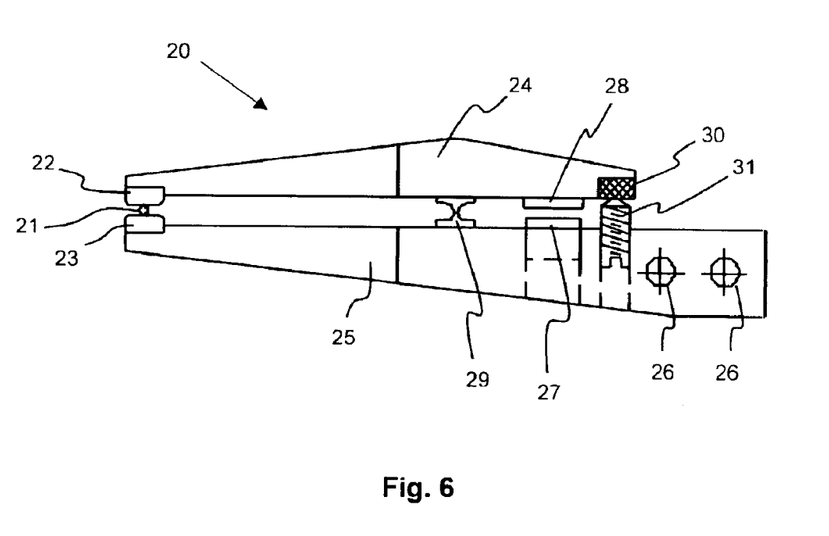
FIG. 6 shows another preferred embodiment of the present invention incorporating a damping feature.

Keeping in mind requirements of compactness and very low weight, visco-elastic damping is most suitable to be used in the present invention in another preferred embodiment as shown in FIG. 6.

A damping mechanism comprising a damper 30, in the form of a-small mass of suitable visco-elastic material is coupled to the movable arm 24. A stopper, which may be in the form of a small screw 31 with a smooth curved tip such as for example a sphere is positioned in the fixed arm 25. When the clamping ends of the clamping device are in the open position, the smooth tip of the screw 31 is made to engage and lightly deform the damper 30 without damaging it. Through judicious choice of material, dimensions and location of the damper 30, it can be ensured that the resulting force on the movable arm 24 and the stiffness of the effective spring action due to the elasticity of the damper 30 is of low enough magnitude in order not to introduce a substantial preload in the damper plates 22, 23 and not to increase substantially the force demands on the solenoid 27 during actuation. With the damper 30 and the screw 31 in the position as shown in FIG. 6, the energy of residual vibration of the movable arm 24, at the end of the clamping and de-clamping strokes is quickly absorbed. This quick attenuation of the vibration amplitude enables faster operation without compromising process quality.

It is to be borne in mind that the representation of the flexure bearing 29, solenoid 27, and damper 30 in the drawings are general in nature and a variety of topologies of these parts are conceivable by those skilled in the art.

Figure 7A:
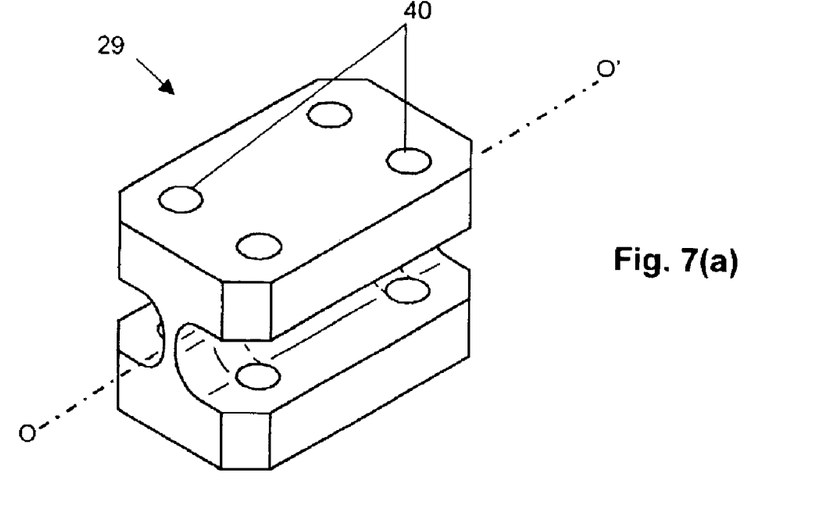
FIGS. 7(a), (b), and (c) illustrate three designs of the flexure bearings.
Figure 7B:
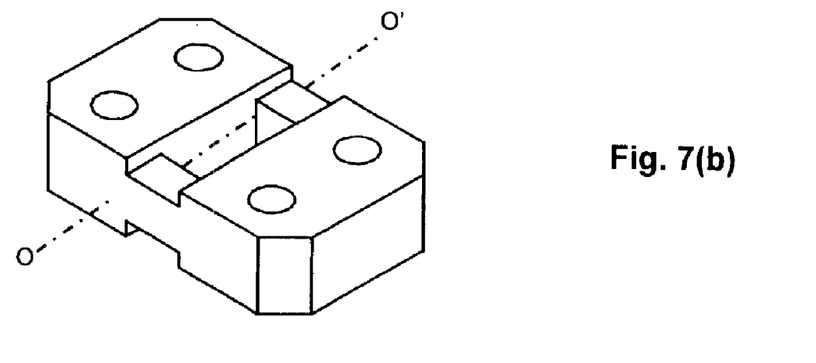
Figure 7C:
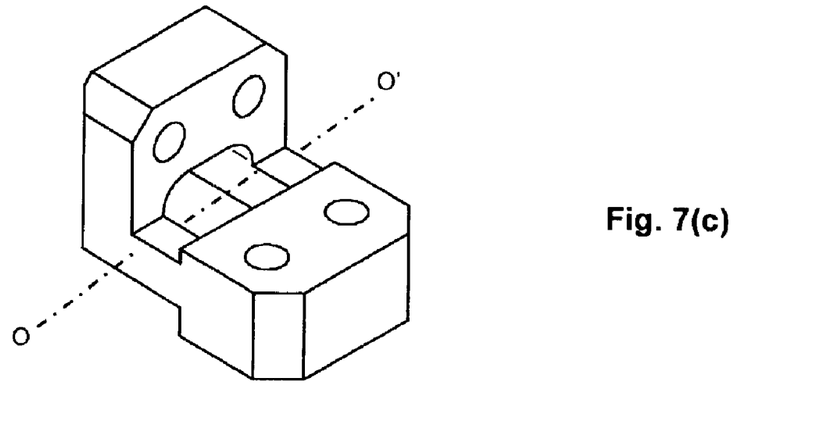

FIGS. 7(a), (b), and (c) illustrate designs of the flexure bearings 29 that may be used with the preferred embodiments of the invention. O–O' in the figures show preferred pivotal axes of the said flexures when manufactured. Flexure mounting holes 40 illustrate positions where the flexures may be mounted to the arms 24, 25 of the wire clamp 20. However, as mentioned above, the illustrated designs are only meant as examples, and other flexure bearing designs are possible.

It would be appreciated that the clamping device according to the embodiments of the invention is of a very compact and lightweight design. This results in substantial reduction in the moment of inertia of the bond-body about its pivot axis, enabling faster operation without a corresponding increase in actuator size. It may also result in considerable cost savings.

The invention described herein is susceptible to variations, modifications and/or additions other than those specifically described and it is to be understood that the invention includes all such variations, modifications and/or additions which fall within the spirit and scope of the above description.

What is claimed is:

1. A clamping device for clamping an object comprising:
   a pair of clamping arms arranged in pivotal relationship with each other about a pivot point, the clamping arms having clamping ends movable between an open position and a closed position;
   an attraction device operative to selectively provide an attraction force between the clamping arms about the pivot point for moving the clamping ends or the clamping arms toward the open position;
   a biasing arrangement operative to provide a biasing force in opposition to the attraction force about the pivot point for biasing the clamping ends of the clamping arms toward the closed position; and
   a damping mechanism comprising a visco-elastic material coupled to one of the clamping arms at a position that is remote from the clamping ends of the clamping arms and operable to attenuate vibrations of the clamping arms.

2. A clamping device as claimed in claim 1, wherein the biasing arrangement comprises a flexure bearing.

3. A clamping device as claimed in claim 2, wherein the pivot point is located on the flexure bearing, and the flexure bearing is adapted to flex about the pivot point.

4. A clamping device as claimed in claim 3, wherein the flexure bearing is adapted to substantially restrict all degrees of relative movement between the clamping ends of the clamping arms except a degree of relative movement towards and away from the open and closed positions.

5. A clamping device as claimed in claim 2, wherein the flexure bearing is made of a metal with high specific strength.

6. A clamping device as claimed in claim 5, wherein the metal is a Titanium alloy.

7. A clamping device as claimed in claim 1, wherein the attraction device is a solenoid.

8. A clamping device as claimed in claim 1, wherein the clamping arms include a fixed clamping arm and a movable clamping arm arranged in pivotal relationship with the fixed clamping arm about the pivot point, and the attraction device is coupled to the fixed clamping arm.

9. A clamping device for clamping an object comprising:
   a fixed clamping arm and a movable clamping arm arranged in pivotal relationship with the fixed clamping arm about a pivot point, the clamping arms having clamping ends movable between an open position and a closed position;
   a first attraction device coupled to the fixed clamping arm and operative to selectively provide a first attraction force for pivoting the movable clamping arm towards the fixed clamping arm about the pivot point; and
   a second attraction device positioned opposite the first attraction device and operative to selectively provide a second attraction force for pivoting the movable clamping arm away from the fixed clamping arm about the pivot point;
   wherein the second attraction force provided by the second attraction device is operative to bias the clamping ends toward the closed position.

10. A clamping device as claimed in claim 1, wherein the biasing arrangement comprises a spring.

11. A clamping device as claimed in claim 1, wherein the biasing arrangement is structured to provide a clamping force between the clamping ends of the clamping arms for clamping the object therebetween.

12. A clamping device as claimed in claim 11, wherein the clamping force is adjustable by changing the attraction force provided by the attraction device relative to the biasing force provided by the biasing arrangement.

13. A clamping device as claimed in claim 1, further comprising a stopper adapted to engage and lightly deform the visco-elastic material of the dampening mechanism when the clamping arms are moved into the open position.

14. A clamping device as claimed in claim 13, wherein the stopper comprises a screw with a smooth curved tip.

15. A clamping device as claimed in claim 1, wherein the object is a bonding wire for a wire bonding machine.

16. A clamping device for clamping an object comprising:
   a pair of clamping arms arranged in pivotal relationship with each other about a pivot point, the clamping arms having clamping ends movable between an open position and a closed position;
   an attraction device operative to selectively provide an attraction force between the clamping arms about the pivot point for moving the clamping ends of the clamping arms toward the open position; and
   a biasing arrangement comprising a flexure bearing operative to provide a biasing force in opposition to the attraction force for biasing the clamping ends of the clamping arms toward the closed position, the flexure bearing being made of Titanium having a high specific strength.

17. A clamping device as claimed in claim 16, wherein the biasing arrangement comprises a second attraction device positioned opposite the first attraction device and the movable clamping arm is movable between the first attraction device and the second attraction device.

18. A clamping device as claimed in claim 16, wherein the pivot point is located on the flexure bearing, and the flexure bearing is adapted to flex about the pivot point.

19. A clamping device as claimed in claim 16, wherein the flexure bearing is adapted to substantially restrict all degrees of relative movement between the clamping ends of the clamping arms except a degree of relative movement towards and away from the open and closed positions.

* * * * *